(12) United States Patent
Rogers et al.

(10) Patent No.: US 9,390,930 B2
(45) Date of Patent: *Jul. 12, 2016

(54) SURFACE STABILIZATION PROCESS TO REDUCE DOPANT DIFFUSION

(71) Applicant: Applied Materials, Inc., Santa Clara, CA (US)

(72) Inventors: Matthew S. Rogers, Mountain View, CA (US); Martin A. Hilkene, Gilroy, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/623,620

(22) Filed: Sep. 20, 2012

(65) Prior Publication Data

US 2013/0109162 A1 May 2, 2013

Related U.S. Application Data

(60) Provisional application No. 61/536,894, filed on Sep. 20, 2011.

(51) Int. Cl.
*H01L 21/324* (2006.01)
*H01L 21/28* (2006.01)
(Continued)

(52) U.S. Cl.
CPC ..... *H01L 21/28273* (2013.01); *H01J 37/32357* (2013.01); *H01L 21/324* (2013.01); *H01L 21/3211* (2013.01); *H01L 21/32155* (2013.01); *H01L 27/11521* (2013.01)

(58) Field of Classification Search
CPC ............ H01L 21/28273; H01L 21/324; H01L 21/32155; H01L 21/3211; H01J 37/32357

USPC .......... 438/45, 474, 513–522, 798, 350, 485, 438/904; 257/E21.135, E21.212
See application file for complete search history.

(56) References Cited

U.S. PATENT DOCUMENTS 6,087,229 A * 7/2000 Aronowitz et al. ........... 438/287
8,741,785 B2 * 6/2014 Olsen et al. ................... 438/776
(Continued)

FOREIGN PATENT DOCUMENTS

KR   10200101100795   12/2001
KR   1020060124591    12/2006
KR   1020110017270    2/2011

OTHER PUBLICATIONS

PCT international search report and written opinion of PCT/US2012/055924 dated Feb. 28, 2013.

*Primary Examiner* — Jarrett Stark
*Assistant Examiner* — Bitew Dinke
(74) *Attorney, Agent, or Firm* — Patterson & Sheridan, LLP

(57) ABSTRACT

A method for incorporating radicals of a plasma into a substrate or a material on a semiconductor substrate using a remote plasma source. In one embodiment, a method for processing doped materials on a substrate surface is provided and includes forming a doped layer on a substrate and optionally cleaning the doped layer, such as by a wet clean process. The method also includes generating an ionized nitrogen plasma in a remote plasma source, wherein the ionized nitrogen plasma has an ion concentration within a range from about 0.001% to about 0.1%, de-ionizing the ionized nitrogen plasma while forming non-ionized nitrogen plasma. The method further includes flowing the non-ionized nitrogen plasma into a processing region within a processing chamber, forming a nitrided capping layer from an upper portion of the doped layer by exposing the doped layer within the processing region to the non-ionized nitrogen plasma during a stabilization process.

25 Claims, 10 Drawing Sheets

(51) Int. Cl.
*H01L 21/3215* (2006.01)
*H01L 21/321* (2006.01)
*H01J 37/32* (2006.01)
*H01L 27/115* (2006.01)

(56) References Cited

U.S. PATENT DOCUMENTS

| | | | |
|---|---|---|---|
| 2002/0023900 A1* | 2/2002 | Mahawili | 219/121.43 |
| 2004/0053478 A1* | 3/2004 | Moustakas | 438/479 |
| 2004/0094813 A1* | 5/2004 | Moore | 257/411 |
| 2005/0153571 A1* | 7/2005 | Senzaki | 438/778 |
| 2005/0255243 A1* | 11/2005 | Senzaki | 427/248.1 |
| 2005/0260347 A1* | 11/2005 | Narwankar et al. | 427/248.1 |
| 2006/0157741 A1* | 7/2006 | Jin | 257/213 |
| 2006/0166476 A1* | 7/2006 | Lee et al. | 438/591 |
| 2006/0257584 A1* | 11/2006 | Derderian et al. | 427/569 |
| 2007/0190801 A1* | 8/2007 | Fujimura et al. | 438/758 |
| 2007/0212896 A1* | 9/2007 | Olsen et al. | 438/758 |
| 2007/0221620 A1* | 9/2007 | Sakthivel et al. | 216/59 |
| 2007/0264776 A1* | 11/2007 | Dong et al. | 438/257 |
| 2007/0287275 A1* | 12/2007 | Adkisson et al. | 438/517 |
| 2008/0233764 A1* | 9/2008 | Takahashi et al. | 438/785 |
| 2009/0035927 A1* | 2/2009 | Olsen et al. | 438/585 |
| 2009/0090952 A1* | 4/2009 | Olsen et al. | 257/314 |
| 2009/0124096 A1* | 5/2009 | Koo et al. | 438/776 |
| 2009/0215253 A1* | 8/2009 | Sandhu et al. | 438/585 |
| 2010/0081290 A1* | 4/2010 | Luo et al. | 438/761 |
| 2010/0089318 A1* | 4/2010 | Ovshinsky | 118/719 |
| 2010/0317186 A1 | 12/2010 | Swenberg et al. | |
| 2011/0217834 A1 | 9/2011 | Ganguly et al. | |
| 2011/0266608 A1* | 11/2011 | Lee et al. | 257/315 |
| 2012/0238074 A1* | 9/2012 | Santhanam et al. | 438/468 |
| 2013/0115763 A1* | 5/2013 | Takamure et al. | 438/513 |
| 2013/0277765 A1* | 10/2013 | Chudzik et al. | 257/411 |

* cited by examiner

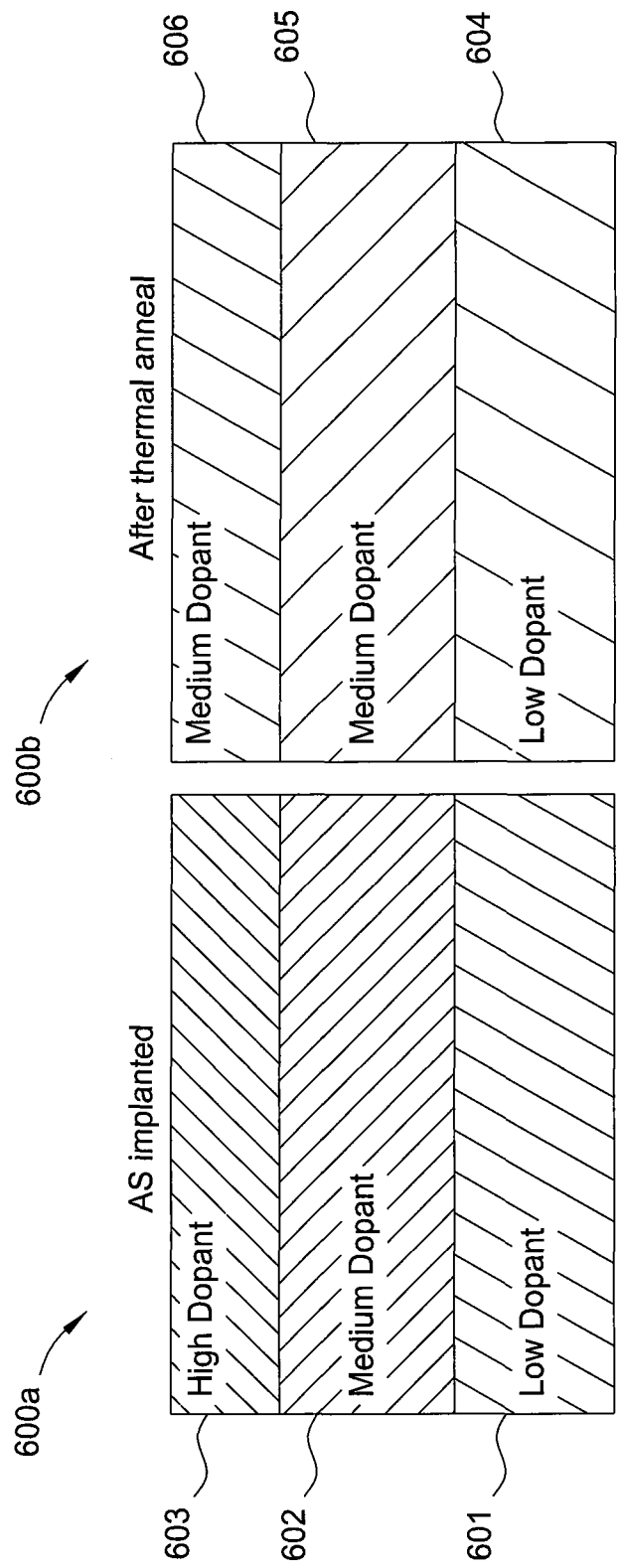

SURFACE STABILIZATION PROCESS TO REDUCE DOPANT DIFFUSION

CROSS-REFERENCE TO RELATED APPLICATION

This application claims benefit of U.S. Provisional Application Ser. No. 61/536,894 filed Sep. 20, 2011, which is incorporated by reference in their entirety.

BACKGROUND

1. Field of the Invention

Embodiments of the invention generally relate to manufacturing semiconductor, memory, solar, and other electronic devices, and more specifically, embodiments described herein relate to methods for fabricating and processing doped materials on a substrate surface.

2. Description of the Related Art

Flash memory, such as NAND flash memory devices, is a commonly used type of non-volatile memory in widespread use for mass storage applications. The NAND flash memory devices typically have a stacked type gate structure in which a tunnel oxide (TO), a floating gate (FG), an inter-poly dielectric (IPD), and a control gate (CG) are sequentially stacked on a semiconductor substrate. The floating gate, the tunnel oxide, and the underlying portion of the substrate generally form a cell (or memory unit) of the NAND flash memory device. A shallow trench isolation (STI) region is disposed in the substrate between each cell adjacent to the tunnel oxide and the floating gate to separate the cell from adjacent cells. During writing of the NAND flash memory devices, a positive voltage is applied to the control gate which draws electrons from the substrate into the floating gate. For erasing data of the NAND flash memory devices, a positive voltage is applied to the substrate to discharge electrons from the floating gate and through the tunnel oxide. The flow of electrons is sensed by a sensing circuitry and results in the returns of "0" or "1" as current indicators. The amount of electrons in the floating gate and "0" or "1" characteristics form the basis for storing data in the NAND flash memory devices.

The floating gate is typically isolated from the semiconductor substrate by the tunnel oxide and from the control gate by the inter-poly dielectric, which prevents the leakage of electrons between, for example, the substrate and the floating gate or the floating gate and the control gate. To enable continued development in physical scaling of the NAND flash memory device, a nitridation process has been used by the industry to incorporate nitrogen into the surface of the floating gate to improve the reliability of the tunnel oxide or to suppress dopant diffusion out of the floating gate. However, the nitridation process also undesirably incorporates nitrogen into shallow trench isolation regions. Nitrogen incorporated in the shallow trench isolation region between neighboring floating gate structures forms a charge leakage path which can negatively impact final device performance.

To insure good contact, and low sheet resistance, high level of dopants (e.g., about $1 \times 10^{15}$ atoms/cm$^2$ or greater) are desired in semiconducting materials, memory device materials, solar materials, and other electronic device materials. One major issue currently faced is dopant out-diffusion during anneal and activation. After dopants are implanted, for example by P3i or a beam-line process, a disordered and unactivated layer exists where many dopant atom lie in interstitial sites or near broken bonds. Typically, a thermal annealing process is used to both repair the damaged semiconductor and promote bond formation of the dopants substitutionally. Dopant requirements are near the solid solubility limits of the semiconductor/dopant system itself, the thermal anneals additional thermal budget often cause out-diffusion of dopants. One technique that may be used to minimize out-diffusion of dopants is to expose the doped material to a laser anneal in which the thermal budget is sufficiently small to minimize dopant diffusion. However, out-diffusion of dopants is often still a problem even after the laser anneal.

Therefore, there is a need for improved methods and for the stabilization of doped materials, such as the nitridation of nitridation of doped silicon or germanium materials.

SUMMARY OF THE INVENTION

Embodiments of the invention generally provide a method for incorporating radicals of a plasma into a substrate or a material on a semiconductor substrate using a remote plasma source. In one embodiment, a method for processing doped materials on a substrate surface is provided and includes forming a doped layer on a substrate, generating an ionized nitrogen plasma in a remote plasma source, wherein the ionized nitrogen plasma has an ion concentration within a range from about 0.001% to about 0.1%, de-ionizing the ionized nitrogen plasma while forming non-ionized nitrogen plasma, flowing the non-ionized nitrogen plasma into a processing region within a processing chamber, forming a nitrided capping layer from an upper portion of the doped layer by exposing the doped layer within the processing region to the non-ionized nitrogen plasma during a stabilization process, wherein the non-ionized nitrogen plasma contains non-charged gaseous species where a ratio of ions relative to the non-charged gaseous species within the processing region is about 1 ppm or less, and heating the substrate containing the nitrided capping layer disposed on the doped layer during a thermal annealing process.

In various examples, the ratio of ions relative to the non-charged gaseous species within the processing region is about 100 ppb or less, such as about 10 ppb or less, such as about 1 ppb or less. Examples are provided wherein the non-charged gaseous species contain nitrogen-containing radical species, nitrogen-containing excited neutral species, and non-excited neutral species.

In another embodiment, a method for processing doped materials on a substrate surface is provided and includes forming a doped layer on a substrate, generating and flowing a nitrogen plasma from a remote plasma source into a processing region within a processing chamber, forming a nitrided capping layer from an upper portion of the doped layer by exposing the doped layer within the processing region to the nitrogen plasma during a stabilization process, wherein the nitrogen plasma contains nitrogen-containing radical species, nitrogen-containing excited neutral species, and non-excited neutral species and the nitrogen plasma has a ratio of the combined nitrogen-containing radical species and the nitrogen-containing excited neutral species relative to the non-excited neutral species within a range from about 0.0001% to about 80%, and heating the substrate containing the nitrided capping layer disposed on the doped layer to a temperature of greater than 400° C. during a thermal annealing process.

The method further includes forming the doped layer on the substrate by an ion implantation doping process, an in-situ ion plasma doping process, or an in-situ doping deposition process, as well as other doping processes. In one example, the doped layer may be formed on the substrate by depositing or otherwise forming a material layer on the substrate and subsequently exposing the material layer to a dopant species.

The material layer may contain silicon, germanium, or combinations thereof. In some examples, the material layer contains a material selected from polycrystalline silicon, amorphous silicon, silicon germanium, silicon oxide, derivatives thereof, or combinations thereof. In an alternative embodiment, the material layer may contain at least one oxide material. Exemplary oxide materials include hafnium oxide, hafnium silicate, zirconium oxide, zirconium silicate, titanium oxide, titanium silicate, aluminum oxide, aluminum silicate, silicon oxide, derivatives thereof, or combinations thereof. Embodiments provide that the dopant species contains an element selected from phosphorous, arsenic, antimony, boron, aluminum, gallium, indium, carbon, or combinations thereof.

In some examples, the doped layer contains polysilicon doped with arsenic and the substrate may be heated and maintained at a temperature of less than 420° C. during the stabilization process. In some embodiments, the nitrided capping layer may have a thickness of about 100 Å or less, such as within a range from about 5 Å to about 50 Å, for example, from about 10 Å to about 40 Å.

The substrate may be heated to a temperature within a range from about 400° C. to about 1,200° C., such as from about 600° C. to about 1,000° C. during the thermal annealing process. In some examples, the substrate may be heated to a temperature within a range from about 600° C. to about 650° C. and exposed to an ammonia soak gas for a time period within a range from about 30 seconds to about 5 minutes during the thermal annealing process. In other examples, the substrate may be heated to a temperature within a range from about 650° C. to about 750° C. and exposed to a nitrogen/oxygen ($N_2/O_2$) soak gas for a time period within a range from about 30 seconds to about 5 minutes during the thermal annealing process. In some examples, the nitrogen/oxygen soak gas may contain oxygen gas ($O_2$) at a volume concentration within a range from about 2% to about 10% and nitrogen gas ($N_2$) at a volume concentration within a range from about 90% to about 98%.

In another embodiment, a remote plasma system includes a remote plasma chamber defining a first region for generating a plasma comprising ions and radicals, a processing chamber defining a second region for processing a semiconductor device, the processing chamber comprising an inlet port formed in a sidewall of the processing chamber, the inlet port being in fluid communication with the second region, and a delivery member for delivering plasma species from the remote plasma chamber to the processing chamber, the delivery member including a body defining a longitudinally extending passageway therein, the body having a first end connecting to the first region and a second end connecting to the second region, the second end being opposed to the first end, wherein the passageway is coupled with the inlet port of the processing chamber such that a longitudinal axis of the passageway intersects at an angle of about 20° to about 80° with respect to a longitudinal axis of the inlet port. In one example, the delivery member further includes a flange extending around an outer surface of the body at the second end, the flange having a surface substantially flush with a surface of a sidewall of the processing chamber.

In another embodiment, a remote plasma system, including a remote plasma chamber defining a first region for generating a plasma comprising ions and radicals, a processing chamber defining a second region for processing a semiconductor device, the processing chamber comprising an inlet port formed in a sidewall of the processing chamber, the inlet port being in fluid communication with the second region, and a delivery member disposed between the remote plasma chamber and the processing chamber and having a passageway in fluid communication with the first region and the inlet port, the delivery member being configured such that a longitudinal axis of the passageway intersects at an angle of about 20° to about 80° with respect to a longitudinal axis of the inlet port.

In yet another embodiment, a method for processing a semiconductor device in a processing region of a processing chamber is disclosed. The method includes generating and flowing plasma species from a remote plasma source to a delivery member having a longitudinal passageway, flowing plasma species from the passageway to an inlet port formed in a sidewall of the processing chamber, wherein the plasma species are flowed at an angle into the inlet port to promote collision of ions or reaction of ions with electrons or charged particles in the plasma species such that ions are substantially eliminated from the plasma species before entering the processing region of the processing chamber, and selectively incorporating atomic radicals from the plasma species in silicon or polysilicon regions of the semiconductor device.

BRIEF DESCRIPTION OF THE DRAWINGS

So that the manner in which the above recited features of the invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

FIG. 6A depicts a graded dopant film without a capping layer prior to exposing the doped film to a thermal annealing process.

FIG. 6B depicts the graded dopant film of FIG. 6A subsequent to exposing the doped film to a thermal annealing process.

DETAILED DESCRIPTION

Embodiments of the invention provide methods and apparatuses for incorporating radicals of a plasma into a substrate or a material on a substrate using a remote plasma source (RPS). In general, plasmas generated by, for example, an energetic excitation of gaseous molecules, contain a plasma of charged ions, radicals, and electrons. For embodiments described herein, radicals of a plasma generally react in a much more desirable manner with silicon or polysilicon material on a substrate, than ions or a mixture of radicals and ions. In that regard, embodiments of the invention provide an apparatus and a method of eliminating the majority of the ions of the plasma such that only radicals of the plasma react with silicon or polysilicon material on a substrate, thereby obtaining a greater selectivity of processing of silicon or polysilicon material on the substrate.

Embodiments of the invention also provide a surface stabilization process which forms a capping layer to maximize dopant retention during subsequent thermal annealing processes of doped materials/layers. The surface stabilization processes may be utilized while processing doped materials during the manufacture or fabrication of devices from a variety of different applications, such as semiconductor devices (e.g., logic gates), memory devices (e.g., DRAM or NAND), solar devices (e.g., photovoltaic cells), and other electronic devices. While embodiments of the invention are not to be limited to a particular device, the apparatus and methods described may be used for the manufacture of semiconductor devices and structures suitable for narrow pitch applications. As used herein, narrow pitch applications include half-pitches of 32 nm or less (e.g., device nodes of 32 nm or less). The term "pitch" as used herein refers to a measure between the parallel structures or the adjacent structures of the semiconductor device. The pitch may be measured from side to side of the same side of the adjacent or substantially parallel structures. The semiconductor devices and structures may be utilized in applications having greater pitches as well. The semiconductor devices may be, for example, NAND or NOR flash memory, or other suitable devices.

Exemplary NAND Flash Memory Device

Figure 1:
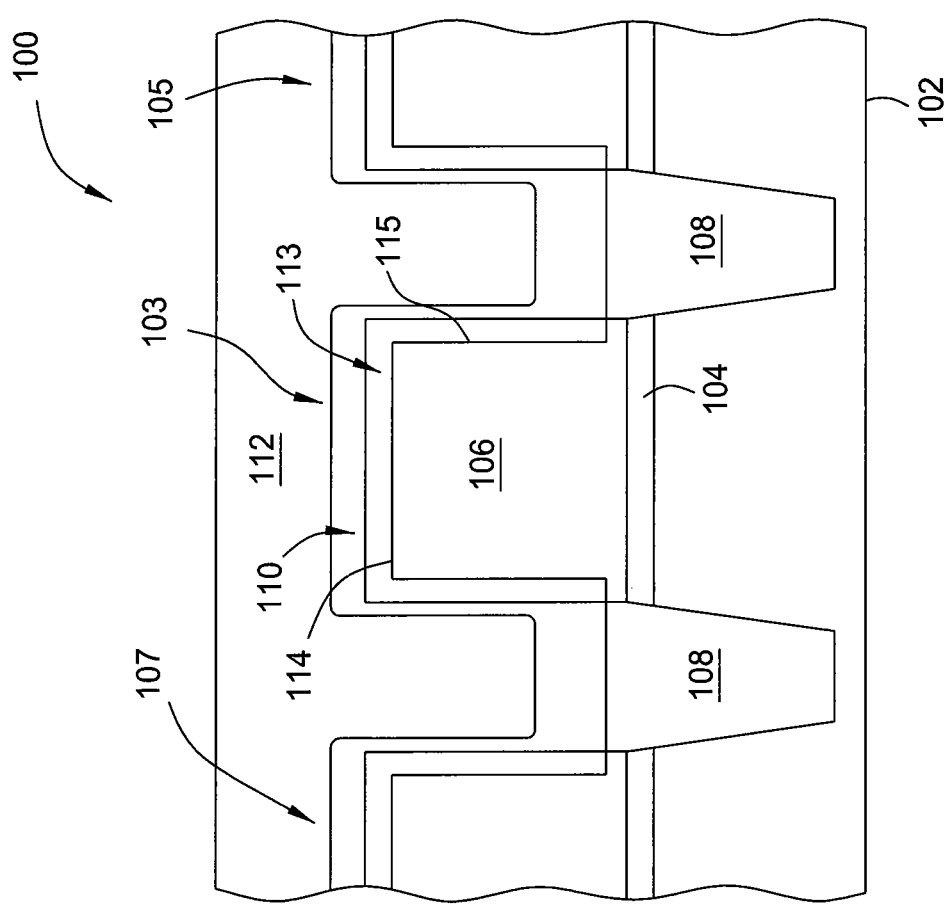
FIG. 1 illustrates a schematic cross-sectional view of an exemplary semiconductor device that can be made with a method and an apparatus according to one embodiment of the invention.

FIG. 1 illustrates a schematic cross-sectional view of an exemplary semiconductor device, such as a NAND flash memory device 100, which may be manufactured—in part—by methods and apparatuses described herein. The memory device 100 generally includes a substrate 102 having a tunnel oxide layer 104 disposed thereon. A floating gate 106 is disposed on the tunnel oxide layer 104. The floating gate 106, the tunnel oxide layer 104, and the underlying portion of the substrate 102 form a cell 103 (or memory unit) of the memory device 100. Each cell 103 of the memory device 100 may be separated, for example, by a shallow trench isolation (STI) region 108 which is disposed in the substrate 102 between each cell 103 (e.g., adjacent to the tunnel oxide layer 104 and floating gate 106, where the STI region 108 separates the cell 103 from adjacent cells 105 and 107). The memory device 100 further includes a control gate layer 112 and an inter-poly dielectric (IPD) layer 110 disposed between the floating gate 106 and the control gate layer 112. The IPD layer 110 separates the floating gate 106 from the control gate layer 112.

The substrate 102 may include a suitable material such as crystalline silicon (e.g., Si<100> or Si<111>), silicon oxide, strained silicon, silicon germanium, doped or undoped polysilicon, doped or undoped silicon wafers, patterned or non-patterned wafers, silicon on insulator (SOI), carbon doped silicon oxides, silicon nitride, doped silicon, germanium, gallium arsenide, glass, sapphire, or the like. In some embodiments, the substrate 102 comprises silicon.

The tunnel oxide layer 104 may include silicon and oxygen, such as silicon oxide ($SiO_2$), silicon oxynitride (SiON), or high-k dielectric materials, such as aluminum-(Al), hafnium-(Hf), or lanthanum-(La), zirconium-(Zr) based oxides or oxynitrides, or silicon nitrides ($Si_xN_y$), in single or layered structures (e.g., $SiO_2$/high-k/$SiO_2$), or the like. The tunnel oxide layer 104 may have any suitable thickness, for example, within a range from about 5 nm to about 12 nm. The tunnel oxide layer 104 may have a width, within each cell, substantially equivalent to the width of a base of the floating gate 106. The STI region 108 may include silicon and oxygen, such as silicon oxide ($SiO_2$), silicon oxynitride (SiON), or the like.

The floating gate 106 typically includes a conductive material, such as silicon, polysilicon, metals, or the like. The floating gate 106 has a configuration suitable to facilitate disposing portions of the control gate layer 112 between adjacent cells (e.g., between cells 103, 105, and 107). As such, the floating gate may be formed in an inverted "T" shape. As used herein, the term inverted "T" refers generally to the geometry of the structure wherein an upper portion of the floating gate 106 is relieved with respect to a base of the floating gate 106. Such relief provides room for the IPD layer 110 to be formed over the floating gate 106 without completely filling the gap between adjacent floating gates 106, thereby allowing a portion of the control gate layer 112 to be disposed between adjacent floating gates 106.

The IPD layer 110 may include any suitable single or multi-layer dielectric materials. An exemplary single layer IPD may include $SiO_2$, SiON, or a high-k dielectric material as discussed above with respect to tunnel oxide layer 104, or the like. An exemplary multi-layer IPD may be a multi-layer "ONO" structure (not shown) including a first oxide layer, a nitride layer, and a second oxide layer. The first and second oxide layers typically include silicon and oxygen, such as silicon oxide ($SiO_2$), silicon oxynitride (SiON), or the like. The nitride layer typically comprises silicon and nitrogen, such as silicon nitride (SiN), or the like. In some embodiments, a multi-layer IPD layer comprising $SiO_2$/high-k/$SiO_2$ (such as, $SiO_2$/$Al_2O_3$/$SiO_2$) can also be used as the IPD layer 110. The IPD layer 110 may be deposited to a thickness of within a range from about 10 nm to about 15 nm.

The control gate layer 112 may be deposited atop the IPD layer 110 to form a control gate. The control gate layer 112 typically comprises a conductive material, such as polysilicon, metal, or the like. The inverted T shape of the floating gate 106 enables a larger surface area, located between adjacent floating gates (for example, those of cells 103 and 105), for the control gate late 112. The increased surface area of the control gate layer 112 may advantageously improve capacitive coupling between a sidewall of the floating gate 106 and the control gate, and may reduce parasitic capacitance between adjacent floating gates, floating gate interference, noise, or the like.

Surface Stabilization Process

In another embodiment, optionally, prior to IPD deposition, a dielectric layer 113 may be conformally formed on the exposed surface of the floating gate 106. Specifically, the dielectric layer 113 is selectively formed mainly on the exposed surface of the floating gate 106, with little or no formation of the dielectric layer 113 on the STI region 108 or any other dielectric films under the identical plasma conditions (will be discussed in detail below). With the dielectric layer 113 selectively formed mainly on floating gate 106, the reliability of the tunnel oxide and/or suppression of dopant diffusion out of the floating gate 106 are improved while enabling scaling of the IPD film stack thickness.

The dielectric layer 113 may be a nitride layer such as silicon nitride or a germanium nitride. The nitride layer may be formed by exposing the field surface 114 and sidewall 115 of the floating gate 106 to nitrogen containing radicals. Nitrogen containing radicals, such as N, NH, and $NH_2$, may be formed by exciting nitrogen-containing gases by a plasma excitation (e.g., MW energy), a photo excitation, an electron-beam excitation, or intense heat.

In some embodiments, a gas source 292 contains a supplies a nitrogen-containing gas, which includes, but not limited to nitrogen ($N_2$), ammonia ($NH_3$), hydrazine ($N_2H_4$), mixtures thereof, or combinations thereof. In other embodiments, a gas source 292 contains a supplies an oxygen-containing gas, which includes, but not limited to nitrogen ($O_2$), nitrous oxide ($N_2O$), water ($H_2O$), hydrogen peroxide ($H_2O_2$), mixtures thereof, or combinations thereof.

Nitridation process may be performed solely by a thermal annealing process, a plasma process, or a combination thereof. In one embodiment, the surfaces of the floating gate 106 are exposed to nitrogen containing radicals using a selective plasma nitridation process. The nitrogen containing radicals will react preferentially with the surface of the floating gate 106 (formed of silicon or polysilicon, for example) during the selective plasma nitridation process, rather than the surface of the STI region 108 (formed of silicon oxide, for example) due to lower Si—Si bond-breaking energies (222 kJ/mol) compared to Si—O bond-breaking energies (452 kJ/mol). As radicals are not reactive enough to break Si—O bond, the selective plasma nitridation process forms nitrides of silicon faster than nitrides of silicon oxide, resulting in a significantly greater concentration of nitrogen-containing material, e.g., dielectric layer 113 formed of, for example, Si—N bonds, at the field surface 114 and sidewall 115 of the floating gate 106 as opposed to STI region 108 between the adjacent floating gates 106. Since the nitrogen-containing material or dielectric layer 113 is not present in significant amounts at STI region 108, the undesired charge leakage path between neighboring floating gate structures does not occur.

The initially generated plasma species described herein generally contain charged gaseous species (e.g., ions—cations or anions) and non-charged gaseous species (e.g., radicals, excited neutrals, and non-excited neutrals). In many embodiments, the charged gaseous species may be reduced or removed from the plasma species prior to treating the substrate to a stabilization process described by embodiments herein. The non-charged gaseous species are utilized in the nitridation or oxidation of doped layers and other material layers during the stabilization processes. The non-charged gaseous species include, but are not limited to radicals (e.g., atomic-N, $NH_2$, NH, $N_3$, atomic-O, $O_3$), excited neutrals (e.g., $N_2^*$, $NH_3^*$, or $O_2^*$), and non-excited neutrals (e.g., $N_2$, $NH_3$, or $O_2$). The excited neutrals within the non-charged gaseous species may be excited vibrationally, electronically, or combinations thereof by an excitation process, such that the electron may be excited to a higher atomic/molecular orbital. Electrons are excited but not removed from the atom/molecule during the excitation process however, electrons are removed from the atom/molecule during the ionization process.

In some embodiments, the generated plasma species may have an ion concentration within a range from about 0.001% to about 0.1%, such as about 0.01%, wherein the ion concentration is determined by the ratio of ions relative to non-charged gaseous species (e.g., radicals, excited neutrals, and non-excited neutrals) inside the RPS unit at about 1 Torr. In many embodiments, the ratio of ions to non-charged gaseous species downstream in the processing region of the processing chamber near the substrate surface is quite small and approaches non-measureable concentrations/amounts. In some examples, there are no ions or substantially no ions in the processing region near the substrate surface. Therefore, in some examples, the ion concentration or the ratio of ions relative to non-charged gaseous species in the processing region near the substrate surface may be about 0.0001% (1 ppm) of less, such as about $1 \times 10^{-7}$ (100 ppb) or less, such as about $1 \times 10^{-8}$ (10 ppb) or less, such as about $1 \times 10^{-9}$ (1 ppb) or less, such as about $1 \times 10^{-10}$ (100 ppt) or less, such as at non-measureable concentrations.

In other embodiments, a concentration of the combined radical species and the excited neutral species within the generated plasma species, in some examples, may be up to about 99% or greater inside the RPS unit at about 1 Torr. The radical/excited neutral concentration may be determined by the ratio of the combined radical species and the excited neutral species relative to the combined non-excited neutral species and ion species (if any ions). Once the generated plasma species have been flowed downstream and are in the processing region of the processing chamber near the substrate surface, the ratio of the combined radical species and the excited neutral species relative to the combined non-excited neutral species and ion species (if any ions) may be within a range from about 0.0001% (1 ppm) to about 99% or greater, for example, within a range from about 0.001% to about 80%, such as from about 0.01% to about 50%. In many examples, the combination of radical species and the excited neutral species of a generated nitrogen plasma contains nitrogen-containing radical species, nitrogen-containing excited neutral species, or combinations thereof.

The terms "radical" or "free radical", as used herein, refers to an electrically uncharged or valence neutral atom, molecule, or molecular fragment having at least one unpaired electron.

The term "ion", as used herein, refers to an electrically charged atom, molecule, or molecular fragment formed by the gain or loss of at least one electron from a neutral valence state.

Radicals are preferred because ions have high chemical activity compared to radicals and compared to the bond energies listed above ($1^{st}$ ionization energy of $N_2$=1402 kJ/mol; atomization energy of $N_2$=473 kJ/mol), so ions do not achieve the selectivity of radicals. Selectivity, defined as concentration of nitrogen in silicon divided by concentration of nitrogen in oxide after a given deposition process, may be within a range from about 10:1 to about 100:1, such as within a range from about 20:1 to about 70:1, for example, about 40:1. Greater exposure time may improve the selectivity.

High radical density versus ion density may be achieved by a high pressure plasma process using, for example, a pressure within a range from about 0.3 Torr to about 20 Torr, for example, about 5 Torr or greater. The high pressure encourages ions to recombine with electrons quickly, leaving neutral radical species and inactive species. In some embodiments, a radical gas is formed. In some embodiments, remote plasma may be used to selectively generate radical species by various methods. The remote plasma generator, for example a microwave, RF, or thermal chamber, may be connected to a processing chamber through a delivery pipe.

The delivery pipe, as will be described in more detail below with respect to FIGS. 3 and 4, may be a relatively long pathway positioned at an angle relative to the processing chamber to encourage recombination of ionic species along the pathway before reaching the processing region. The radicals flowing through the delivery pipe continue to flow into the processing region through a showerhead or radical distributor, or through a portal entry in a side wall of the processing chamber. The radicals may have a flow rate within a range from about 1 sLm to about 20 sLm, such as from about 5 sLm to about 20 sLm, for example, about 10 sLm. Higher pressures and lower flows are believed to promote collisions. Nitrogen radicals may be formed in one embodiment by exposing a nitrogen containing gas, such as nitrogen, ammonia, or a mixture thereof, optionally with a carrier gas such as helium, argon, or neon to microwave power within a range from about 1 kW to about 3 kW and at a pressure of greater than about 5 Torr. In some examples, the microwave source may be set at a frequency of about 2 GHz.

In some embodiments, the nitridation process may be performed at a substrate temperature within a range from about 300° C. to about 1,200° C. In some examples, the substrate temperature may be within a range from about 300° C. to about 600° C., such as from about 400° C. to about 500° C. In other examples, the substrate temperature may be within a range from about 600° C. to about 1,200° C., such as from about 800° C. to about 1,000° C., which may be increased as the nitridation proceeds to combat surface saturation. Heating may be performed using lamp heating, laser heating, use of a heated substrate support, or by plasma heating. In one example, ammonia gas may be used to form a nitrogen plasma.

In certain embodiments, various ion filters, such as electrostatic filters operated at a bias of, for example, about 200 V (RF or DC), wire or mesh filters, or magnetic filters, any of which may have a dielectric coating, may be used between the remote plasma source and the processing chamber. In other embodiments, residence time in the remote plasma generator may be modulated using gas flow of reactive species such as nitrogen containing species or gas flow of non-reactive species such as argon or helium. In some embodiments, radical half-life may be extended by using an ion filter with low pressure plasma generation. Low pressure operation may be facilitated by integrating a processing chamber with a remote plasma chamber without using an O-ring to seal the pathway between the two chambers. Uniformity of radical flow into a processing chamber from remote plasma generation chamber may be improved using a shaped connector to provide intimate control of flow patterns.

In some embodiments, an in situ plasma generation process may be used, energized for example by microwave, UV, RF, or electron synchrotron radiation, with an ion filter, such as any of the ion filters described above, or an ion shield, such as a mesh or perforated plate, disposed between the gas distributor and the substrate support in the chamber. In one embodiment, a showerhead with ion filter capability (e.g., electrically isolated or with controlled electric potential) may be disposed between a plasma generation zone and the substrate processing zone to allow radicals to enter the substrate processing zone while filtering ions.

FIG. 6A depicts a graded dopant film 600a containing multiple doped regions prior to exposing the doped film to a thermal annealing process. The doped film 610a does not have a capping layer disposed thereon. The dopant concentration gradient extends throughout the doped film 600a— which is illustrated as having a low dopant concentration in a lower portion 601 of the doped film 600a, a medium dopant concentration in a middle portion 602 of the doped film 600a, and a high dopant concentration in an upper portion 603 of the doped film 600a.

The doped film 600a without a capping layer depicted in FIG. 6A may be exposed to a thermal annealing process to form the annealed doped film 600b depicted in FIG. 6B. The upper portion 606 of the annealed doped film 600b displays out-diffusion of dopant subsequent to the thermal annealing process. The high dopant concentration in an upper portion 603 of the doped film 600a was reduced to form a medium dopant concentration in the upper portion of the annealed doped film 600b. Dopants may be lost from the upper surface of the doped material, such as by dopant diffusion into surrounding materials and/or dopant sublimation or evaporation into the processing chamber.

Figure 6C:
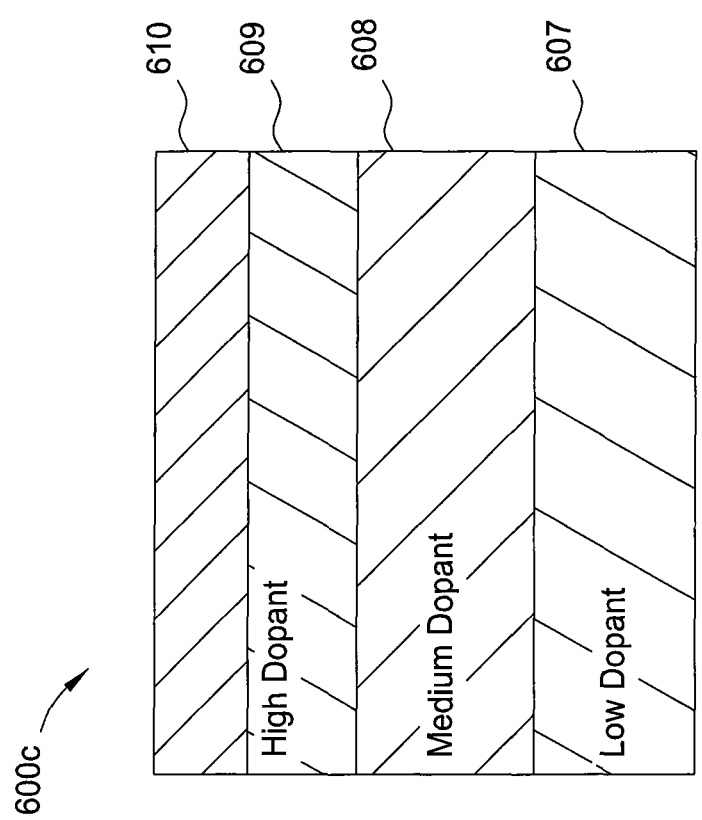
FIG. 6C depicts the graded dopant film of FIG. 6A with a capping layer and illustrated subsequent to exposing the doped film to a thermal annealing process.

FIG. 6C depicts the annealed doped film 600c containing a capping layer 610, as described in embodiments herein. The capping layer 610 is formed by the surface stabilization processes described herein and generally contains a nitrided layer of the doped film, such as silicon nitride. The annealed doped film 600c is identical to the doped film 600a with the exception of having the capping layer 610 and the annealed, doped film 600c has already been exposed to a thermal annealing process. The dopant concentration gradient remains subsequent to the thermal annealing process and extends throughout the annealed doped film 600c—which is illustrated as having a low dopant concentration in a lower portion of the annealed doped film 600c, a medium dopant concentration in a middle portion of the annealed doped film 600c, and a high dopant concentration in an upper portion of the annealed doped film 600c.

Embodiments of the invention as described herein contemplate that substantially all ions formed in the plasma during the plasma generation (with the radicals) are eliminated prior to coming in contact with the surface of the floating gate 106 (formed of silicon or polysilicon, for example) during the selective plasma nitridation process, rather than the surface of the STI region 108 (formed of silicon oxide, for example). One way positively charged ions are eliminated is by combining with electrons (also present in the plasma during the plasma generation) to return to a non-ionic or non-charged, neutral state. A plasma may be substantially free of the majority of the ions by separating the plasma generation source from the substrate location, e.g., the reaction site, by a distance longer than the lifetime of the ions at a given plasma discharge rate. In this manner, the radicals survive the travel distance into the processing region and to the substrate, but ions do not and instead lose their ionic character and become charge neutral.

In another embodiment described herein, an RTP or RTP-like system may be utilized to perform the thermal annealing process with a special low temperature reactive gas step inserted to an in-situ capping layer (e.g., silicon nitride) while completely preventing or substantially preventing dopant out-diffusion from the doped layer. Some of the embodiments may be applicable to most or all doped material, but in many examples, the doped material generally contains silicon-based materials, germanium-based materials, or combinations of silicon and germanium.

Figure 5:
FIG. 5 is a flow chart illustrating a method for processing doped materials on a substrate, as described by embodiments herein.

FIG. 5 is a flow chart illustrating a method, such as process 500, processing doped materials on a substrate, as described by embodiments herein. In one embodiment, a method for processing doped materials on a substrate surface is provided and includes forming a doped layer on a substrate (step 510) and optionally cleaning the doped layer, such as by a wet clean process (step 520). Process 500 also includes generating an ionized nitrogen plasma in a remote plasma source, wherein the ionized nitrogen plasma has an ion concentration within a range from about 0.001% to about 0.1%, de-ionizing the ionized nitrogen plasma while forming non-ionized nitrogen plasma. Process 500 further includes flowing the non-ionized nitrogen plasma into a processing region within a processing chamber, forming a nitrided capping layer from an upper portion of the doped layer by exposing the doped layer within the processing region to the non-ionized nitrogen plasma during a stabilization process (step 530). The non-ionized nitrogen plasma generally contains non-charged gaseous species and has an ion concentration where a ratio of ions relative to the non-charged gaseous species within the processing region is about 1 ppm or less. Process 500 further includes heating the substrate containing the nitrided capping layer disposed on the doped layer during a thermal annealing process, such as an RTP process (step 540).

In some embodiments, steps 530 and 540 may be conducted or otherwise performed consecutively, that is, step 530 prior to step 540. However, in other embodiments, steps 530 and 540 may be simultaneously conducted or otherwise performed in the same process chamber, such as a thermal annealing chamber containing an RPS unit for delivering radicals and excited neutral species.

In various examples, the ratio of ions relative to the non-charged gaseous species within the processing region is about 100 ppb or less, such as about 10 ppb or less, such as about 1 ppb or less. Examples are provided wherein the non-charged gaseous species contain nitrogen-containing radical species, nitrogen-containing excited neutral species, and non-excited neutral species.

In another embodiment, process 500 includes forming a doped layer on a substrate (step 510), generating and flowing a nitrogen plasma from a remote plasma source into a processing region within a processing chamber and forming a nitrided capping layer from an upper portion of the doped layer by exposing the doped layer within the processing region to the nitrogen plasma during a stabilization process (step 530). The nitrogen plasma generally contains nitrogen-containing radical species, nitrogen-containing excited neutral species, and non-excited neutral species and the nitrogen plasma has a ratio of the combined nitrogen-containing radical species and the nitrogen-containing excited neutral species relative to the non-excited neutral species within a range from about 0.0001% to about 80%. Process 500 may further include heating the substrate containing the nitrided capping layer disposed on the doped layer to a temperature of greater than 400° C., during a thermal annealing process.

Step 510 of process 500 includes forming the doped layer on the substrate. The doped layer may be formed on the substrate by an ion implantation doping process, an in-situ ion plasma doping process, or an in-situ doping deposition process, as well as other doping processes. In one example, the doped layer may be formed on the substrate by depositing or otherwise forming a material layer on the substrate and subsequently exposing the material layer to a dopant species. The doped layer or the material layer contains at least one base material, such as silicon, germanium, or combinations thereof. In some examples, the base material of the doped layer and/or the material layer contains a material selected from polycrystalline silicon, amorphous silicon, silicon germanium, silicon oxide, derivatives thereof, or combinations thereof.

In an alternative embodiment, the base material of the doped layer and/or the material layer may contain at least one oxide material. Exemplary oxide materials include hafnium oxide, hafnium silicate, zirconium oxide, zirconium silicate, titanium oxide, titanium silicate, aluminum oxide, aluminum silicate, silicon oxide, derivatives thereof, or combinations thereof.

Embodiments provide that the dopant species contains an element selected from phosphorous, arsenic, antimony, boron, aluminum, gallium, gallium arsenide, indium, carbon, germanium, or combinations thereof. In some examples, the doped layer contains polysilicon doped with arsenic and the substrate may be heated and maintained at a temperature of less than 420° C. during the stabilization process. In some embodiments, the nitrided capping layer may have a thickness of about 100 Å or less, such as within a range from about 5 Å to about 50 Å, for example, from about 10 Å to about 40 Å.

Step 540 of process 500, the substrate may be heated to a temperature within a range from about 400° C. to about 1,200° C., such as from about 600° C. to about 1,000° C. during the thermal annealing process. In some examples, the substrate may be heated to a temperature within a range from about 600° C. to about 650° C. and exposed to an ammonia soak gas for a time period within a range from about 30 seconds to about 5 minutes during the thermal annealing process. In other examples, the substrate may be heated to a temperature within a range from about 650° C. to about 750° C. and exposed to a nitrogen/oxygen ($N_2/O_2$) soak gas for a time period within a range from about 30 seconds to about 5 minutes during the thermal annealing process. In some examples, the nitrogen/oxygen soak gas may contain oxygen gas ($O_2$) at a volume concentration within a range from about 2% to about 10% and nitrogen gas ($N_2$) at a volume concentration within a range from about 90% to about 98%.

In one embodiment, the in-situ capping layer is formed prior to heating the substrate to the dopant out-diffusion temperature during a thermal annealing process. In another embodiment, the in-situ capping layer is formed simultaneously as heating the substrate during the thermal annealing process. In one example of a stabilization process, a doped material layer containing polysilicon doped with arsenic is initially exposed to a nitridation step to form a silicon nitride capping layer thereon while heating and maintaining the substrate at or below the dopant out-diffusion temperature of about 420° C. Once the silicon nitride capping layer formed to a predetermined thickness, the substrate may be heated to a higher temperature during a thermal annealing process.

An improvement of about 6 fold in sheet resistance was observed for thermal anneals with identical thermal budgets with the top surface capped in-situ during heating vs no capping (see Table 1). The improvement was demonstrated by utilizing a remote plasma source with nitrogen during the annealing of phosphorous doped Si. The remote plasma source stabilized the surface of the material during the ramp from about 300° C. to about 600° C. with a very thin nitride <1 nm. This could also have been accomplished using oxygen radicals or excited oxygen species to create a thin oxide film.

TABLE 1

| P3i dopant condition | RPN | MW | Rs |
|---|---|---|---|
| $PH_3$; 7 Kv; 10 s | 1,000° C. for 10 s | On | 87.2 |
| $PH_3$; 7 Kv; 10 s | 1,000° C. for 10 s | On | 82.6 |
| $PH_3$; 7 Kv; 10 s | 1,000° C. for 10 s | Off | 587.1 |

Figure 7:
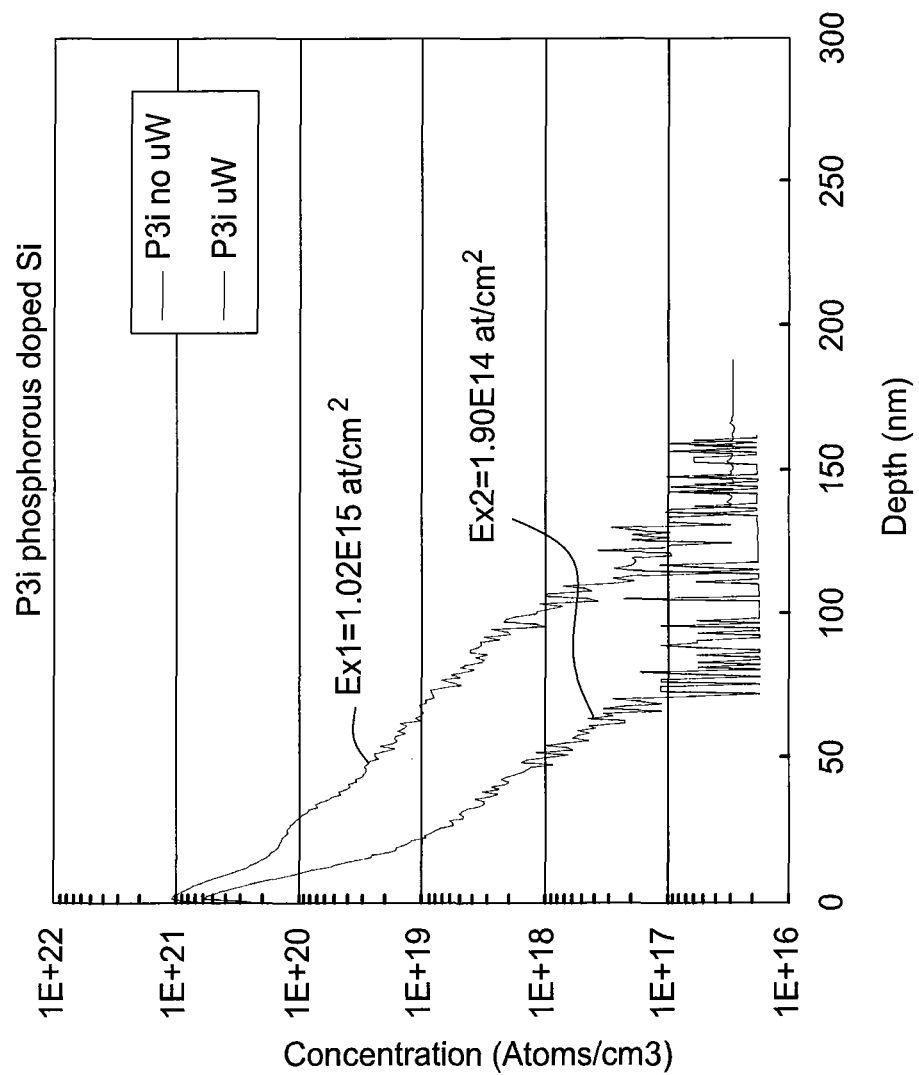
FIG. 7 depicts a profile graph of SIMS data providing dopant concentrations relative to depths for two comparative examples, as described by some embodiments disclosed herein.

FIG. 7 depicts a profile graph of SIMS data providing phosphorous dopant concentrations relative to depths for two comparative examples, as described by some embodiments disclosed herein. The SIMS data shows an increased dopant retention of phosphorous doped silicon (e.g., P3i doped silicon) when thermally annealed for about 10 seconds at about 1,000° C. with the microwave unit powered on (RPS unit). Examples provide an increase of about 5 fold in phosphorous dopant retention had occurred with the RPS unit powered on during the anneal (Example 1: $1.02 \times 10^{15}$ P atoms/cm$^2$) compared to the same thermal budget with the RPS unit not powered during the anneal (Example 2: $1.90 \times 10^{14}$ P atoms/cm$^2$). The depth increase in dopant concentration is likely caused by an increase in concentration enhanced diffusion.

Figure 8:
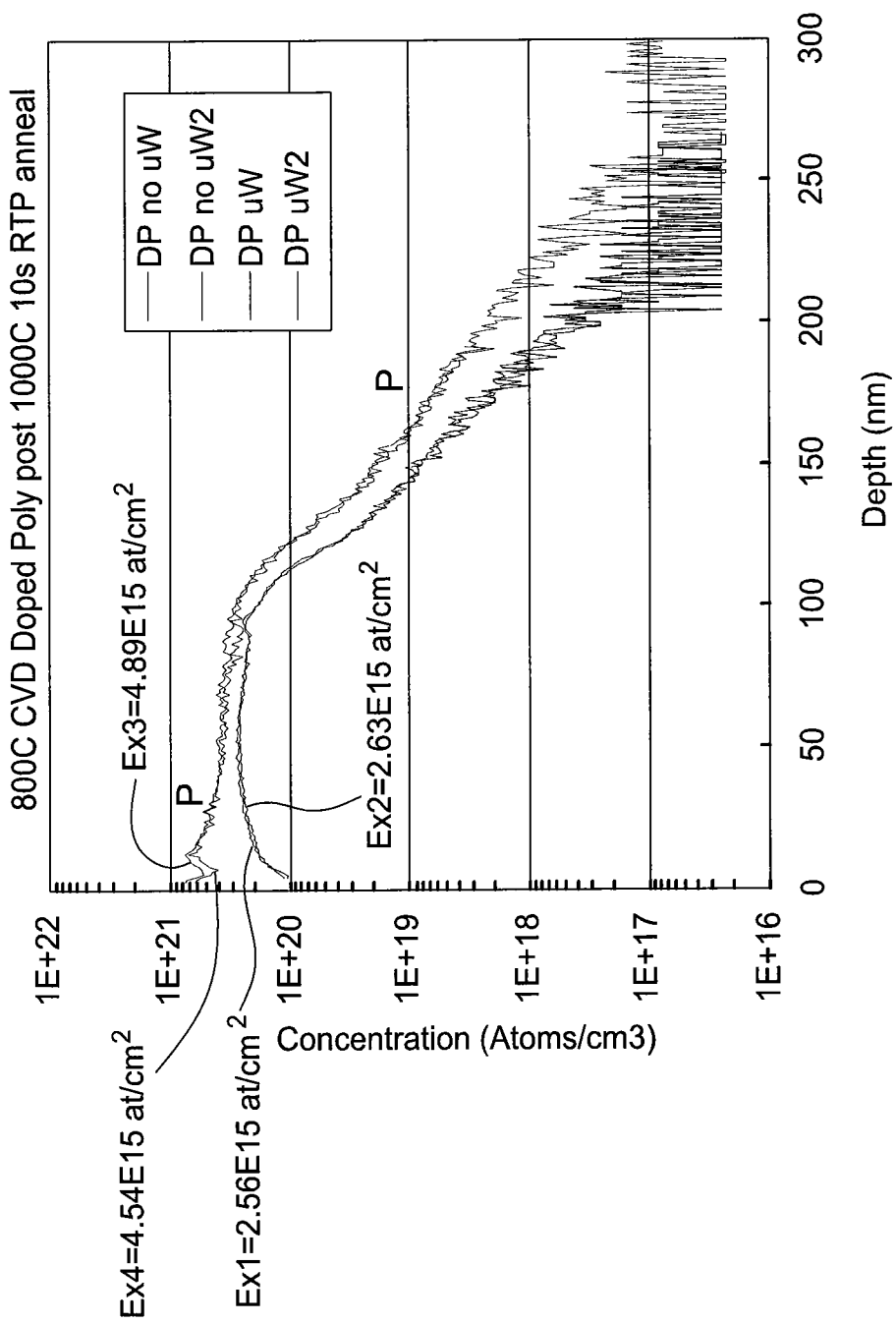
FIG. 8 depicts another profile graph of SIMS data providing dopant concentrations relative to depths for four comparative examples, as described by some embodiments disclosed herein.

FIG. 8 depicts another profile graph of SIMS data providing dopant concentrations relative to depths for four comparative examples—Examples 1-4—for CVD phosphorous doped polysilicon. The SIMS profile after a thermal annealing process (for about 10 seconds at about 1,000° C.) is provided with or without the RPS (MW) powered on at 800° C. for the phosphorous doped polysilicon.

The phosphorous doped polysilicon of Example 1 was not exposed to the microwave excited plasma from the RPS (no capping layer) and retained about $2.56 \times 10^{15}$ P atoms/cm$^2$ post the RTP anneal. The phosphorous doped polysilicon of Example 2 was not exposed to the microwave excited plasma from the RPS (no capping layer) and retained about $2.63 \times 10^{15}$ P atoms/cm$^2$ post the RTP anneal.

The phosphorous doped polysilicon of Example 3 was exposed to the microwave excited plasma from the RPS (formation of capping layer) and retained about $4.89 \times 10^{15}$ P atoms/cm$^2$ post the RTP anneal. The phosphorous doped polysilicon of Example 4 was exposed to the microwave excited plasma from the RPS (formation of capping layer) and retained about $4.54 \times 10^{15}$ P atoms/cm$^2$ post the RTP anneal.

The graph in FIG. 8 illustrates the applicability to CVD deposited doped polysilicon. The SIMS results show an increase of about 1.8 fold in dopant retention during the anneal. The in-situ deposited doped poly-Si is thought to be less surface sensitive due to a flat top profile with depth verse the surface high profile that is observed in examples for P3i implanted. Additionally, the processing of the processing of the doped poly and anneal involved a significantly long air break which may have helped to stabilize the doped poly surface. Regardless, the same trend of increasing surface concentration and overall dopant retention is observed with the use of the RPS unit during the anneal to form a capping layer of silicon nitride.

Figure 9:
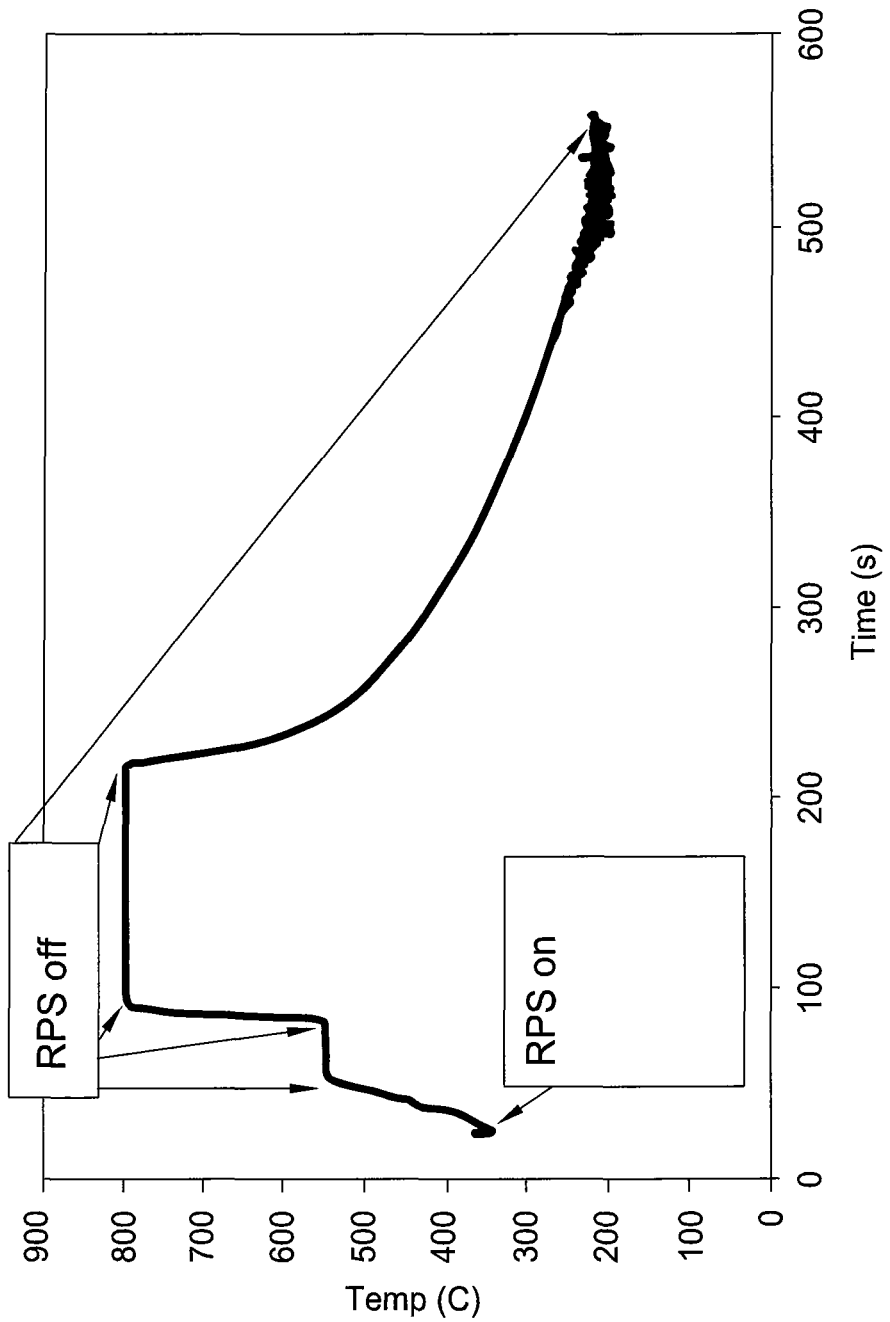
FIG. 9 depicts a graph illustrating a temperature trace during an RTP anneal sequence, as described by some embodiments disclosed herein.

The graph in FIG. 9 illustrates a wafer temperature trace during a thermal annealing process, such as an RTP anneal, as described in embodiments disclosed herein. In this example, the soak temperature is about 800° C. for about 120 seconds, whereas the previous tests were performed for about 10 seconds at about 1,000° C. Different schemes are shown as to when to power the RPS unit on or off—therefore—forming a capping layer. The RPS unit may be switched/powered on at a low temperature to minimize dopant out-diffusion, but there are several schemes (e.g., different times and/or temperatures) for switching/powering off the RPS unit. The longer the RPS is on, the longer the exposure of the plasma containing radicals, and the thicker the capping layer. The thickness of the capping layer utilized to minimize dopant out-diffusion and fit within the particular integration scheme will likely depend upon the particular dopant and application specifics.

The doped materials include of in-situ capping during thermal annealing process and activation of doped semiconductors. Additionally, the hardware as described herein delivers active species while forming the capping layer at low temperature (e.g., <500° C. and <420° C.) before the higher temperature anneal or activation process.

In some examples, an improvement of about 6 fold in sheet resistance has been demonstrated on P3i phosphorous doped silicon exposed to a nitrogen anneal (about 10 seconds at about 1,000° C.) when in-situ capping is applied. The capping layer may be formed using a RPS through which nitrogen was flowing while the wafer temperature was within the range of about 300° C. to about 600° C. In some embodiments, the plasma generation source used to excite species in the vicinity of the thermal annealing process or dopant activation chamber (e.g., hot wire, e-beam source).

In another embodiment, a mainframe tool may be configured to have a plasma doping chamber, such as the P3i clustered chamber commercially available from Applied Materials, Inc. and an anneal chamber, for example, a rapid thermal processing (RTP) chamber, such as the RTP Byron chamber, which is commercially available from Applied Materials, Inc. In one example, the substrate may be moved from the plasma doping chamber to the anneal chamber without a vacuum/air break and staying under the controlled environment of the mainframe tool. Therefore, the substrate and materials thereon may be exposed to a doping process in the doping chamber and then exposed to a surface stabilization process and a RTP process in the RTP chamber without ever being exposed to ambient conditions (e.g., water or oxygen exposure). In another example, the substrate may be moved from the plasma doping chamber into the ambient to a clean chamber (e.g., wet clean chamber) and then to the anneal chamber. In some examples, the surface stabilization process and the RTP process may be consecutively conducted in the same chamber. In other examples, the surface stabilization process and the RTP process may be simultaneously conducted in the same chamber.

Exemplary Remote Plasma System

Figure 2:
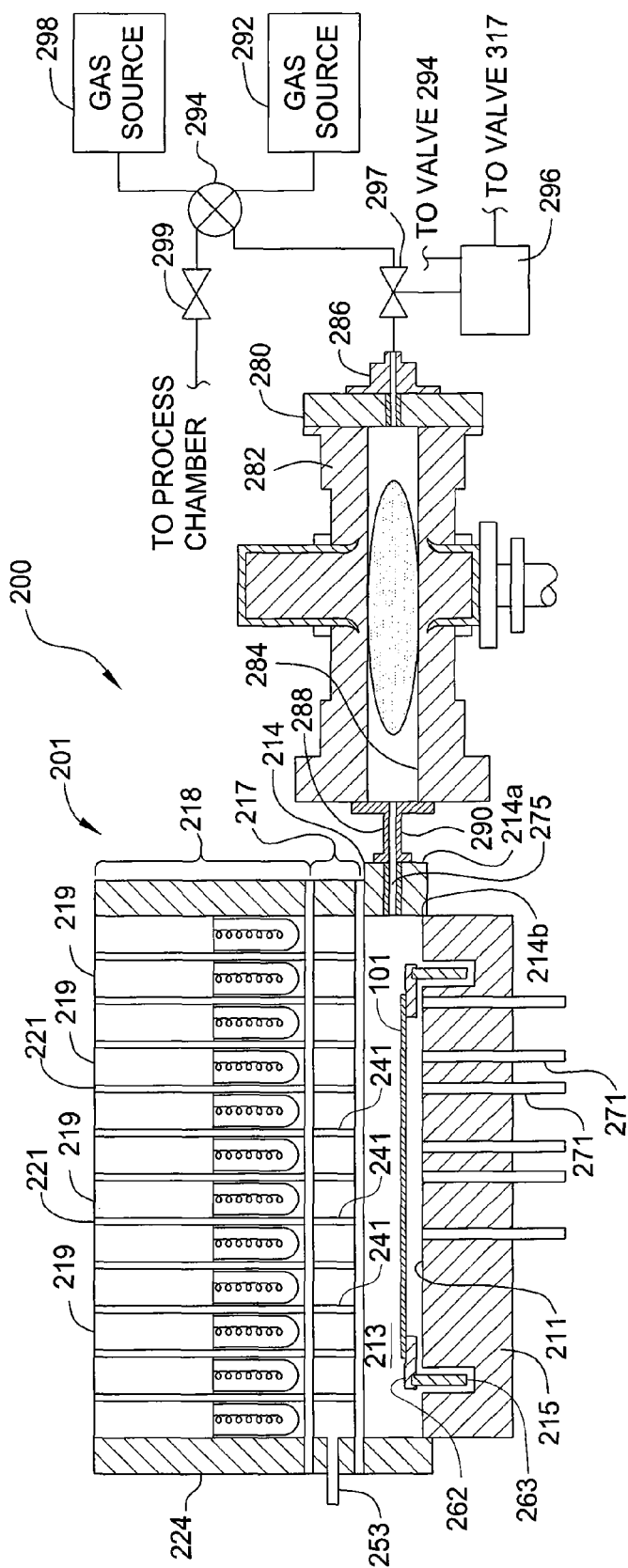
FIG. 2 illustrates a schematic view of a remote plasma system in accordance with one embodiment of the invention.

FIG. 2 illustrates an exemplary remote plasma system 200 may benefit from embodiments of the invention. Particularly, the remote plasma system 200 may be used to selectively form a nitride layer on a silicon or polysilicon surface of a semiconductor structure, such as a NAND flash memory device 100. The remote plasma system 200 may include a rapid thermal processing (RTP) apparatus 201, such as CENTURA® RTP commercially available from Applied Materials, Inc., located in Santa Clara, Calif. Other types of thermal reactors may be substituted for the RTP apparatus such as, for example, RPN, RPO, VANTAGE® RADIANCEPLUS™ RTP, VANTAGE® RADOX™ RTP, RADIANCE® RTP, or other similar chambers/reactors available from Applied Materials Inc. of Santa Clara, Calif.

A plasma applicator 280 may be coupled with the RTP apparatus 201 and used to remotely provide radicals of a plasma to the RTP apparatus 201. The RTP apparatus 201 generally includes a processing region 213 enclosed by a side wall 214 and a bottom wall 215. The upper portion of side wall 214 may be sealed to a window assembly 217 by O-rings. A radiant energy light pipe assembly 218 (enclosed by an upper side wall 224) is positioned over and coupled with window assembly 217. Light pipe assembly 218 may include a plurality of tungsten halogen lamps 219 each mounted into light pipes 221 and positioned to adequately cover the entire surface area of wafer or substrate 101. Window assembly 217 may include a plurality of short light pipes 241. A vacuum can be produced in the plurality of light pipes 241 by pumping through a tube 253 connected to one of the light pipes 241 which is in turn connected to the rest of the pipes.

Wafer or substrate 101 containing the NAND flash memory device 100 is supported by a support ring 262 within a processing region 213. Support ring 262 is mounted on a rotatable cylinder 263. By rotating cylinder 263, support ring 262 and wafer or substrate 101 are caused to rotate during processing. Bottom wall 215 of RTP apparatus 201 may be coated or provided with a reflector 211 for reflecting energy onto the backside of wafer or substrate 101. The RTP apparatus 201 may include a plurality of fiber optic probes 271 positioned through bottom wall 215 of RTP apparatus 201 to detect the temperature of wafer or substrate.

The plasma applicator 280 generally includes a body 282 surrounding a tube 284 where a plasma of ions, radicals, and electrons is generated. The tube 284 may be made of quartz or sapphire. The tube 284 preferably does not have any electrical bias present that might attract charged particles, e.g., ions. A gas inlet 286 is disposed at one end of the body 282 and opposing to a gas outlet 288 that is located at the other end of the body 282. The gas outlet 288 is in fluid communication with the RTP apparatus 201 through a delivery pipe 290 such that radicals of the plasma generated within the tube 284 are supplied to the processing region 213 of the RTP apparatus 201. The gas outlet 288 may have a diameter larger than gas inlet 286 to allow the excited radicals to be efficiently discharged at desired flow rate and to minimize the contact between the radicals and the tube 284. If desired, a separate orifice may be inserted into tube 284 at the gas outlet 288 to reduce the inner diameter of the tube 284. The diameter of the gas outlet 288 (or orifice, if used) can be selected to optimize the pressure differential between the processing region 213 and the plasma applicator 280 for nitridation efficiency.

A gas source 292 contains a supplies a nitrogen-containing gas, which includes, but not limited to nitrogen ($N_2$), ammonia ($NH_3$), hydrazine ($N_2H_4$), mixtures thereof, or combinations thereof. The gas source 292 may be coupled with a gas inlet 286 via a first input of a three-way valve 294 and a valve 297 used to control the flow rate of gas released from the gas source 292. A second input of the three-way valve 294 may be coupled with another process gas source 298 including, but not limited to, oxygen-containing gas, silicon-containing gas, or inner gas. A flow controller 296 is connected to the three-way valve 294 to move the valve between different positions, depending upon which process is to be carried out. The flow controller 296 also functions in a similar fashion to control the three-way valve 294 and the valve 317 to provide an appropriate process gas flow from gas source 298 to the processing chamber.

The plasma applicator 280 may be coupled with an energy source (not shown) to provide an excitation energy, such as an energy having a microwave frequency, to the plasma applicator 280 to excite the process gas traveling from the gas source 292 into a plasma. In the case where nitrogen-containing gas, for example, $N_2$, is used, the microwave excitation in plasma applicator 280 produces nitrogen radicals (e.g., N*), positively charged ions (e.g., $N^+$ or $N_2^+$), and electrons ($e^-$) in the tube 284. By locating the plasma applicator 280 remotely from the processing region 213 of RTP apparatus 201, a plasma source can be selectively generated to limit the composition of the plasma exposed to substrate 101 to predominantly radicals. It has been observed that ions collisions can be further promoted by using an improved delivery pipe 290 such that all or the majority of ions generated by the excitation of the process gas to form a plasma outlive their ionic lifetime and become charge neutral before reaching the processing region 213. In other words, the composition of the plasma that is supplied to the inlet port 275 of the RTP apparatus 201 is predominantly radicals.

Figure 3:
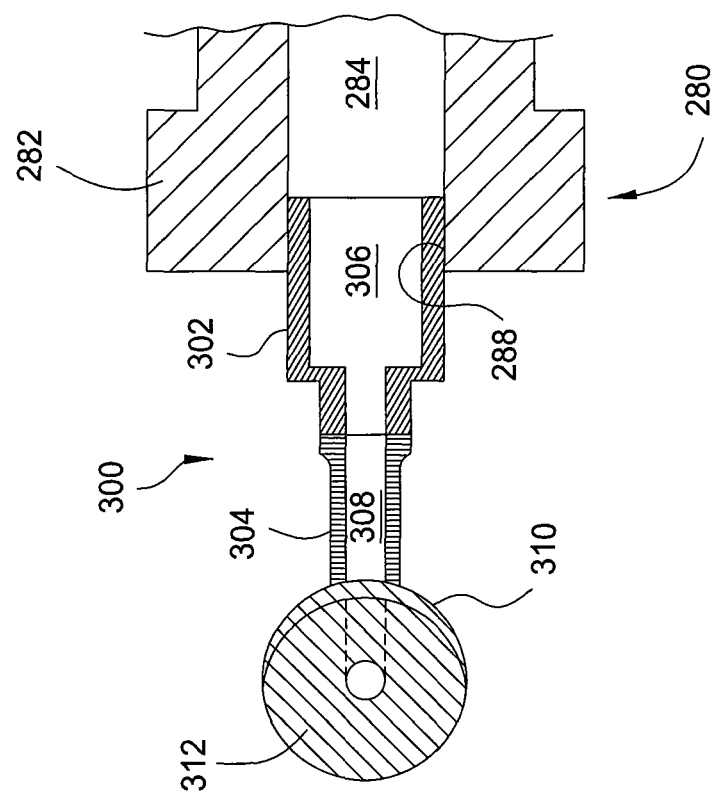
FIG. 3 illustrates a schematic and fragmentary cross-sectional side view of an exemplary delivery pipe for use in supplying radicals of a plasma to an RTP apparatus according to one embodiment of the invention.

FIG. 3 illustrates a schematic and fragmentary cross-sectional side view of an exemplary delivery pipe 300 that may be used in place of the delivery pipe 290 of FIG. 2 according to one embodiment of the invention. For the purpose of simplicity and clarity of illustration, elements in the drawings have not been drawn to scale. The delivery pipe 300 generally includes a mounting sleeve 302 and an inlet member 304 connecting to the mounting sleeve 302. The mounting sleeve 302 and the inlet member 304 each include a hollow cylindrical body defining a longitudinally extending space, for example, sleeve passageway 306 and inlet passageway 308. The profile of the passageway 306, 308 may be any shape such as circular, oval, square, rectangular, or irregular. One end of the mounting sleeve 302 may be bolted to the gas outlet 288 of the body 282 of the plasma applicator 280 (partially shown) so that the sleeve passageway 306 in the mounting sleeve 302 is aligned with and coupled with the tube 284 at the gas outlet 288. Another end of the mounting sleeve 302 is connected to the inlet member 304 so that the inlet passageway 308 in the inlet member 304 is substantially aligned with the sleeve passageway 306 in the mounting sleeve 302. In certain examples, the diameter of the mounting sleeve 302 may be gradually reduced along the longitudinal axis of the mounting sleeve 302 to match the diameter of the inlet member 304. The mounting sleeve 302 and the inlet member 304 may be made of a material that does not cause recombination of the N* radicals. For example, the mounting sleeve 302 and the inlet member 304 may be made of silicon, silicon nitride, boron nitride, carbon nitride, sapphire, alumina, or derivatives thereof. While the delivery pipe 300 is shown and described as two separate components (e.g., the mounting sleeve 302 and the inlet member 304) being connected to one another, the invention contemplates a delivery pipe formed from a single-piece integrated body with a passageway connecting to the inlet port 275 of the RTP apparatus 201.

Figure 4:
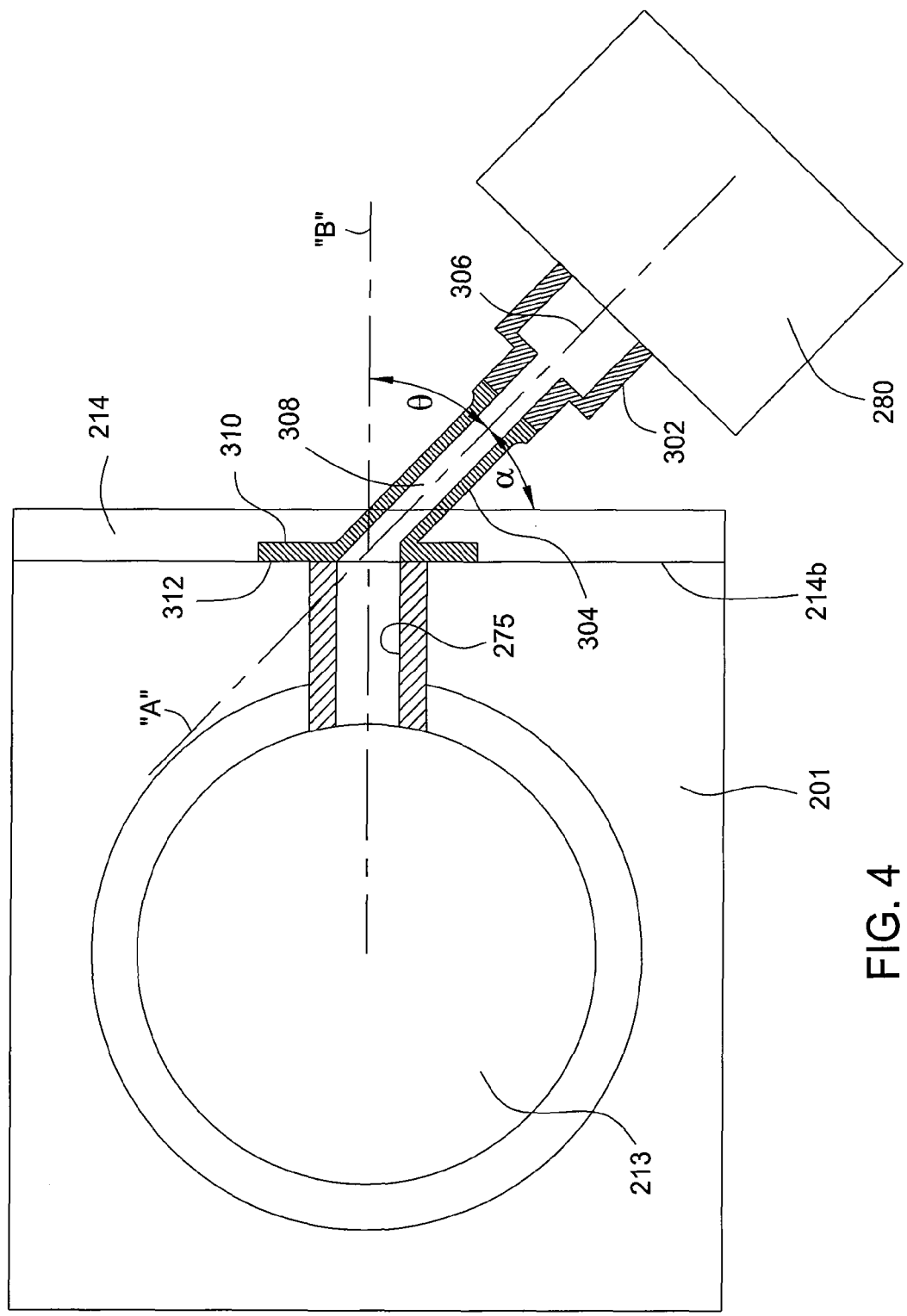
FIG. 4 illustrates a schematic and fragmentary top view of a delivery pipe of FIG. 3 and an RTP apparatus in accordance with an embodiment of the invention.

As can be better seen in FIG. 4, which illustrates a schematic and fragmentary top view of the delivery pipe 300 and the RTP apparatus 201, the inlet member 304 may be configured as an adapter which is coupled with the inlet port 275 in the side wall 214 of the RTP apparatus 201. It should be noted that some elements in FIG. 4 have been omitted and not drawn to scale for the purpose of simplicity and clarity of illustration. The inlet member 304 may include a flange 310 extending wholly around the outer surface of the inlet member 304. A portion of the inlet member 304 may be extended into the side wall 214 such that an outermost face 312 of the flange 310 is bolted to the interior surface 214b of the side wall 214. Alternatively, the outermost face 312 of the flange 310 may be bolted to the exterior surface 214a of the side wall 214 and configured in a way that the inlet passageway 308 is coupled with the inlet port 275. In either case, the delivery pipe 300 is coupled with the inlet port 275 in such a way that a longitudinal axis "A" of the inlet passageway 308 in the inlet member 304 intersect at an angle θ with respect to a longitudinal axis "B" of the inlet port 275. The flange 310 may extend in a direction at a desired angle "α" relative to the longitudinal axis "A" of the inlet passageway 308 as long as that the outermost face 312 of the flange 310 is substantially flush with interior surface 214b of the side wall 214.

In one embodiment, the angle "α" may be within a range from about 20° to about 80°, such as about 45° to about 70°. The angle θ between the longitudinal axis "A" of the inlet passageway 308 and the longitudinal axis "B" of the inlet port 275 may be within a range from about 10° to about 70°, such as from about 20° to about 45°. In one example, the angle α is about 45° or greater, for example, about 60°. The angle α or θ should not be limited as defined herein and may vary as necessary. Delivery pipe 300 may be positioned at an angle relative to the inlet port 275 to promote collision of ions or reaction of ions with electrons or other charged particles since the ions lose their momentum through collisions when hitting the interior surface of the inlet port 275. Therefore, all ions or substantially all ions formed by the excitation of the energy source are eliminated prior to entering the processing region 213, while all radicals or substantially all radicals formed by the excitation of the energy source are preserved and flow into the processing region 213. The delivery pipe 300 is shown and described to include the flange 310, however, the flange 310 may be omitted as long as the delivery pipe 300 is coupled with the RTP apparatus 201 at an angle that would promote collision of ions or reaction of ions with electrons or other charged particles.

In addition to the bent pipe structure as described herein, the delivery pipe 300 may be constructed of a length such that, for a given flow rate of a process gas (e.g., a given plasma generation rate), substantially all ions are extinguished or reacted with electrons or other charged particles to lose their excited state prior to existing the delivery pipe 300. The length of tube 284 and delivery pipe 300 necessary to extinguish substantially all the ions of a plasma at a given source gas flow rate may be determined experimentally or by lifetime calculations. In one embodiment, the tube 284 may have a length within a range from about 5 inches to about 12 inches and an inside diameter within a range from about 0.5 inches to about 2 inches. The length of the delivery pipe 300 (including the inlet and the sleeve passageways 306, 308) may vary within a range from about 5 inches to about 25 inches, for example, about 16 inches or greater. The diameters of passageways 306, 308 may be independently adjusted or have an independent length to optimize the pressure differential between the plasma applicator 280 and the processing region 213. In one embodiment, each of the diameters of passageways 306, 308 is within a range from about 0.5 inches to about 2 inches, for example, from about 0.65 inches to about 1.5 inches in diameter. If desired, either one or both of the passageways 306, 308 may have a diameter gradually decreasing or increasing in the direction of flow to promote ion loss. In various embodiments, the total length of the tube 284 and the delivery pipe 300 may be within a range from about 8 inches to about 35 inches, for example, about 20 inches or greater. It is believed that a converging flow of plasma will promote ions collisions. The compression ratio, defined as cross sectional area of plasma generation area, (e.g., the tube 284) to cross sectional area of smallest diameter before the inlet port 275 (e.g., the inlet passageway 308) may be about 2 or greater, for example within a range from about 5 to about 10 or greater.

By separating the plasma generation area (e.g., plasma applicator 280) and the processing region 213 physically with an improved delivery pipe 300 being positioned at an angle relative to an inlet port 275 of the RTP apparatus that promotes recombination of ionic species, greater selectivity of nitridation of silicon or polysilicon floating gate 106 is obtained. In an embodiment where a NAND flash memory device having a floating gate 106 with silicon or polysilicon surface is treated with a selective nitridation process performed by the apparatus described herein, selectivity of nitridation of silicon or polysilicon floating gate 106 to STI region 108 may be increased to up to about 100:1 with a nitrogen dose of about $5\times10^{15}$ atoms/cm$^2$ to about $15\times10^{15}$ atoms/cm$^2$, such as about $20\times10^{15}$ atoms/cm$^2$ or up, for example, about $25\times10^{15}$ atoms/cm$^2$, in the surface of silicon or polysilicon floating gate 106.

While the foregoing is directed to embodiments of the invention, other and further embodiments of the invention may be devised without departing from the basic scope thereof, and the scope thereof is determined by the claims that follow.

The invention claimed is:

1. A method for processing doped materials on a substrate surface, comprising:
    forming a doped layer on a substrate;
    generating an ionized nitrogen plasma in a remote plasma source, wherein the ionized nitrogen plasma is supplied through an inlet port to a processing chamber at an ion concentration within a range from 0.001% to 0.1%, wherein the remote plasma source is coupled to the processing chamber by an angled pipeline coupled to the inlet port and having an angle relative to the inlet port, wherein the angled pipeline encourages recombination of ions formed in the angled pipeline;
    de-ionizing the ionized nitrogen plasma while forming non-ionized nitrogen plasma by maintaining a processing pressure at 5 Torr or greater, but less than 20 Torr;
    flowing the non-ionized nitrogen plasma into a processing region within a processing chamber;
    forming a nitrided capping layer from an upper portion of the doped layer by exposing the doped layer within the processing region to the non-ionized nitrogen plasma during a stabilization process, wherein the non-ionized nitrogen plasma comprises non-charged gaseous species where a ratio of ions relative to the non-charged gaseous species within the processing region is 1 ppm or less; and
    heating the substrate containing the nitrided capping layer disposed on the doped layer during a thermal annealing process.

2. The method of claim 1, wherein the ratio of ions relative to the non-charged gaseous species within the processing region is 100 ppb or less.

3. The method of claim 2, wherein the ratio of ions relative to the non-charged gaseous species within the processing region is 10 ppb or less.

4. The method of claim 3, wherein the ratio of ions relative to the non-charged gaseous species within the processing region is 1 ppb or less.

5. The method of claim 1, wherein the non-charged gaseous species comprises nitrogen-containing radical species, nitrogen-containing excited neutral species, and non-excited neutral species.

6. The method of claim 1, further comprising forming the doped layer on the substrate by a process selected from an ion implantation doping process, an in-situ ion plasma doping process, or an in-situ doping deposition process.

7. The method of claim 1, further comprising forming the doped layer on the substrate by: forming a material layer on the substrate; and exposing the material layer to a dopant species while forming the doped layer.

8. The method of claim 7, wherein the material layer comprises silicon or germanium.

9. The method of claim 8, wherein the material layer comprises a material selected from the group consisting of polycrystalline silicon, amorphous silicon, silicon germanium, silicon oxide, derivatives thereof, and combinations thereof.

10. The method of claim 9, wherein the material layer comprises at least one oxide material.

11. The method of claim 10, wherein the material layer comprises a material selected from the group consisting of hafnium oxide, hafnium silicate, zirconium oxide, zirconium silicate, titanium oxide, titanium silicate, aluminum oxide, aluminum silicate, silicon oxide, derivatives thereof, and combinations thereof.

12. The method of claim 7, wherein the dopant species comprises an element selected from the group consisting of phosphorous, arsenic, antimony, boron, aluminum, gallium, indium, carbon, and combinations thereof.

13. The method of claim 1, wherein the doped layer comprises polysilicon doped with arsenic.

14. The method of claim 13, wherein the substrate is heated and maintained at a temperature of less than 420° C. during the stabilization process.

15. The method of claim 1, wherein the nitrided capping layer has a thickness within a range from 5 Å to 50 Å.

16. The method of claim 15, wherein the thickness is within a range from 10 Å to 40 Å.

17. The method of claim 1, wherein the substrate is heated to a temperature within a range from 400° C. to 1,200° C. during the thermal annealing process.

18. The method of claim 17, wherein the substrate is heated to a temperature within a range from 600° C. to 1,000° C. during the thermal annealing process.

19. The method of claim 18, wherein the substrate is heated to a temperature within a range from 600° C. to 650° C. and exposed to an ammonia soak gas during the thermal annealing process.

20. The method of claim 19, wherein the substrate is exposed to the ammonia soak gas for a time period within a range from 30 seconds to 5 minutes during the thermal annealing process.

21. The method of claim 18, wherein the substrate is heated to a temperature within a range from 650° C. to 750° C. and exposed to a nitrogen/oxygen ($N_2/O_2$) soak gas during the thermal annealing process.

22. The method of claim 21, wherein the substrate is exposed to the nitrogen/oxygen soak gas for a time period within a range from 30 seconds to 5 minutes during the thermal annealing process.

23. The method of claim 21, wherein the nitrogen/oxygen soak gas comprises oxygen gas at a volume concentration within a range from 2% to 10% and nitrogen gas at a volume concentration within a range from 90% to 98%.

24. The method of claim 1, wherein the angled pipeline has an angle of between 20 degrees and 80 degrees to a longitudinal axis of the inlet port defined in the processing chamber connecting the angled pipeline.

25. The method of claim 1, wherein the angled pipeline has an adjustable diameter to adjust pressure differential between the remote plasma source and the processing chamber.

* * * * *